(12) United States Patent
Nakano et al.

(10) Patent No.: US 7,288,844 B2
(45) Date of Patent: Oct. 30, 2007

(54) SEMICONDUCTOR DEVICE, SEMICONDUCTOR CIRCUIT AND METHOD FOR PRODUCING SEMICONDUCTOR DEVICE

(75) Inventors: Takashi Nakano, Tokyo (JP); Hirokazu Tohya, Tokyo (JP)

(73) Assignee: NEC Corporation, Tokyo (JP)

(*) Notice: Subject to any disclaimer, the term of this patent is extended or adjusted under 35 U.S.C. 154(b) by 333 days.

(21) Appl. No.: 10/518,157

(22) PCT Filed: Jun. 11, 2003

(86) PCT No.: PCT/JP03/07397

§ 371 (c)(1),
(2), (4) Date: Dec. 10, 2004

(87) PCT Pub. No.: WO03/107445

PCT Pub. Date: Dec. 24, 2003

(65) Prior Publication Data

US 2005/0236651 A1    Oct. 27, 2005

(30) Foreign Application Priority Data

Jun. 12, 2002    (JP) .................. 2002-170840

(51) Int. Cl.
*H01L 29/40* (2006.01)
(52) U.S. Cl. .................. 257/758; 257/207; 438/128
(58) Field of Classification Search ........ 257/207, 257/758, 665; 432/128, 129
See application file for complete search history.

(56) References Cited

U.S. PATENT DOCUMENTS 4,639,690 A *   1/1987  Lewis ................... 331/96
4,945,399 A     7/1990  Brown et al.
5,854,534 A *   12/1998 Beilin et al. ............ 257/691
6,747,299 B2*   6/2004  Mimino et al. .......... 257/259
2002/0011606 A1  1/2002  Otake et al.
2002/0024407 A1  2/2002  Arai et al.

FOREIGN PATENT DOCUMENTS

| EP | 0788118 A1 | 8/1997 |
|---|---|---|
| JP | 53-164659 | 12/1978 |
| JP | 56-062354 | 5/1981 |
| JP | 5-160334 | 6/1993 |
| JP | 6-216309 | 8/1994 |
| JP | 06-216309 | 8/1994 |
| JP | 8-316404 | 11/1996 |
| JP | 8-330738 | 12/1996 |
| JP | 9-208627 | 8/1997 |
| JP | 10-270643 | 10/1998 |
| JP | 11-177276 | 7/1999 |

(Continued)

*Primary Examiner*—Roy Potter
(74) *Attorney, Agent, or Firm*—Scully, Scott, Murphy & Presser, P.C.

(57) ABSTRACT

The present invention is provided with a transmission line element having a ground wiring and a power supply wiring formed interposing an insulating film, on the power supply wiring on a semiconductor chip, lead or printed-circuit board, such that the capacitance per unit length of the transmission line element is boosted to set the characteristic impedance of the transmission line element for the high frequency range to an optimum value. In this way, the power supply wiring inclusive of the transmission line element can have a satisfactory decoupling performance.

24 Claims, 17 Drawing Sheets

FOREIGN PATENT DOCUMENTS

| | | |
|---|---|---|
| JP | 2001-168223 | 6/2001 |
| JP | 2001-203455 | 7/2001 |
| JP | 2001-267751 | 9/2001 |
| JP | 2001-274314 | 10/2001 |
| JP | 2001-338836 | 12/2001 |
| JP | 2002-009244 | 1/2002 |
| JP | 2002-26272 | 1/2002 |
| JP | 2002-164760 | 6/2002 |

\* cited by examiner

A CHARACTERISTIC IMPEDANCE
OF THE TRANSMISSION LINE ELEMENT $Z_c$ (Ω)

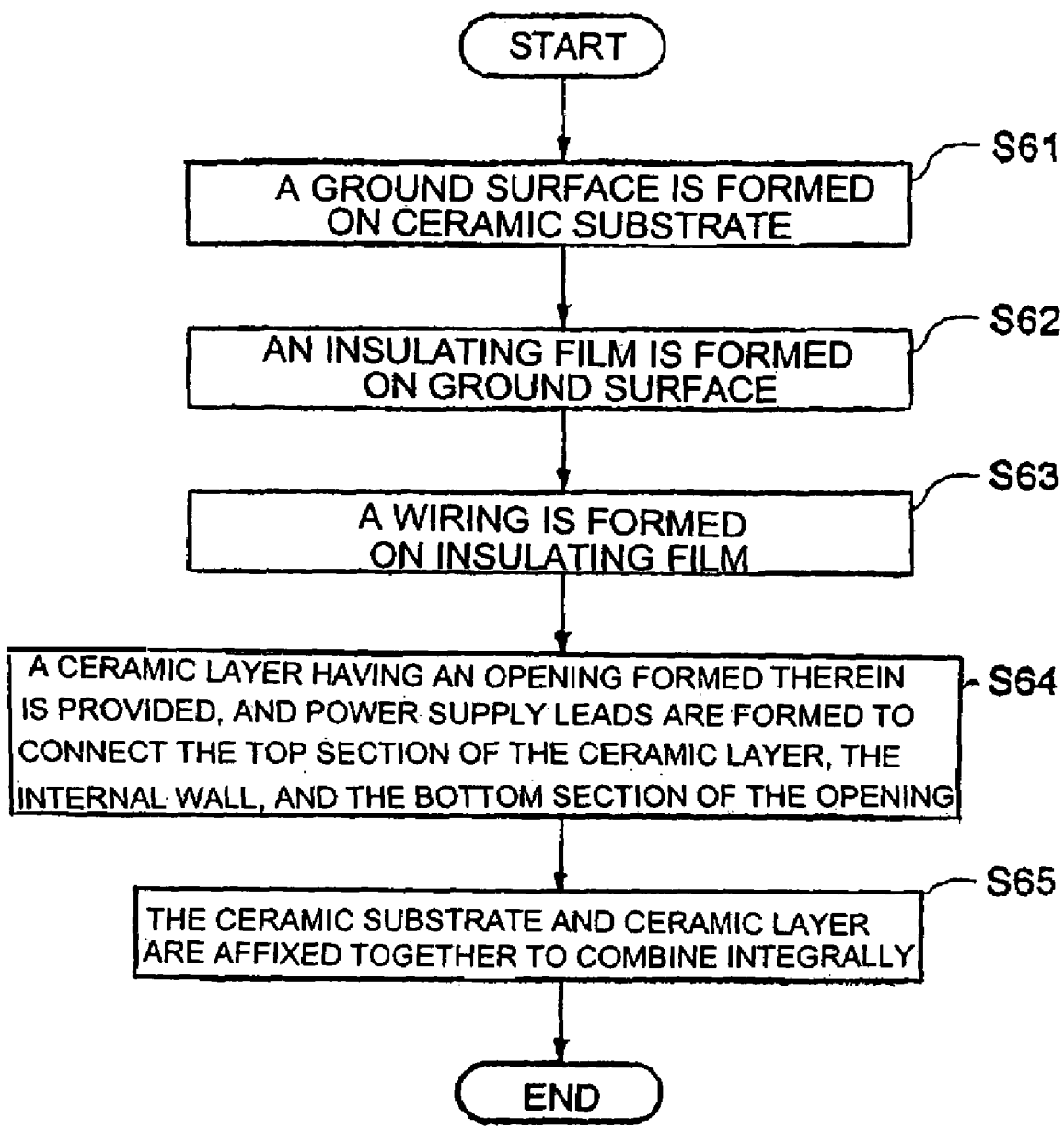

SEMICONDUCTOR DEVICE, SEMICONDUCTOR CIRCUIT AND METHOD FOR PRODUCING SEMICONDUCTOR DEVICE

TECHNICAL FIELD

The present invention relates to a semiconductor device and a semiconductor circuit, particularly to a semiconductor device and a semiconductor circuit provided with a decoupling circuit for reducing a high frequency noise that leaks through a power supply wiring.

BACKGROUND ART

In a digital circuit, high frequency noises generated incidentally to switching operations of a semiconductor element cause electromagnetic interferences. This high frequency noise mainly includes high-order harmonics of the fundamental clock frequency. For example, a part of the high frequency noises generated in an element in an LSI (Large Scale Integration) that makes a switching operation (hereinafter referred to as a switching element) propagates through the power supply wiring in the LSI and further leaks through the package of interest into the power supply wirings etc. of the printed-circuit board having the LSI mounted on.

The high frequency noises, which propagate through the power supply wirings, couple with the package and signal wirings on the printed-circuit board, etc. in the LSI through electromagnetic induction in the propagation paths. This electromagnetic coupling causes the high frequency noises to superimpose on the signals carried through signal wirings to yield distortions of the signal voltages. Furthermore, in the case where the surge impedance of the power supply wiring viewed from the switching element is high, the creation of the high frequency noise brings about the creation of an electromagnetic wave, which is emitted from the signal cable and devices.

It is advantageous to arrange decoupling circuits adaptive to the frequencies of the generated high frequency noises in most effective positions in order to relieve the above problems.

In the conventional decoupling circuit as described, for example, in JP H10-270643, a capacitor equivalent to a lumped constant has been arranged between a power supply wiring and a ground potential wiring, because the sizes of the elements that constitute the circuit, such as a transistor, a resistor, a capacitor, etc., are small as compared with the signal wavelength corresponding to the operation frequency of the subject circuit.

Concerning other conventional decoupling circuits, JP 2001-168223 describes a technology of increasing the decoupling capacitance between ground and power supply rings; and JP H06-216309 describes a technology of providing a decoupling capacitor on a lead frame of the semiconductor device. For reference, the above technologies relate to decoupling capacitors inserted between a power supply wiring and a ground potential wiring provided on the same plane and fundamentally differ in the construction from the decoupling circuits of the present invention described later in that a power supply wiring and a ground potential wiring are formed in different layers.

In the circuitry in which a capacitor is employed as a decoupling circuit, it is necessary to take into account the inductance component included in series with the connection terminal for the noises in a high frequency range. In other words, a capacitor includes both capacitance and inductance components representing a capacitive characteristic at the frequency lower than the series resonance frequency of the capacitance and inductance and an inductive characteristic at the frequency higher than the series resonance frequency. Accordingly, when using a capacitor as a decoupling circuit, the decoupling circuit becomes more inductive as the frequency becomes higher, resulting in degradation of the decoupling performance.

As a countermeasure to address such an issue, there is a method in which many capacitors are arranged in a distributed configuration near the package, or in the printed-circuit board in the LSI. Even if this method is employed, however, the inductance of the terminals and transmission lines for connecting the capacitors and power supply wiring has an unnegligible magnitude. For this reason, it has been difficult to operate the capacitors as a decoupling circuit for a frequency range of several hundreds MHz or higher.

The operations of recent digital circuits have been sped up to have the operation frequencies as high as several GHz. Consequently, it is imperative that a decoupling circuit has an impedance kept at a low value in the frequency range higher than hundreds MHz, or preferably several tens GHz, in order to suppress an electromagnetic interference and improve a signal quality. For this end, it is necessary to develop a circuit element or an element structure differing from the conventional capacitor in order to be capable of retaining low impedance in a high frequency range.

It is an object of the present invention to provide a semiconductor device and a semiconductor circuit provided with a decoupling circuit capable of retaining a low impedance up to the frequency higher than several hundreds MHz, and preferably several tens GHz.

DISCLOSURE OF INVENTION

In order to achieve the above-described object, the present invention implements a transmission line element having a ground wiring and a power supply wiring formed interposing an insulating film, on the power supply wiring on a semiconductor chip, lead or printed-circuit board, such that the capacitance per unit length of the transmission line element is increased to set the characteristic impedance of the transmission line element to an optimum value for the high frequency range. In this way, the power supply wiring inclusive of the transmission line element can have a satisfactory decoupling performance. Because this construction of the transmission line provides a decoupling circuit having an excellent decoupling performance for a higher frequency range than the conventional transmission line, the creation of the high frequency noise that propagates from a switching element to a DC power supply through a power supply wiring is suppressed to result in suppression of the electromagnetic interference and also reduction of the distortion in the waveform of a signal attributed to the high frequency noise generated by the switching element.

BRIEF DESCRIPTION OF DRAWINGS

FIG. 27 is a flow chart illustrating the method of fabricating the semiconductor device of the sixth embodiment.

BEST MODE FOR CARRYING OUT THE INVENTION

Explanation is next presented regarding the present invention with reference to drawings.

Figure 1:
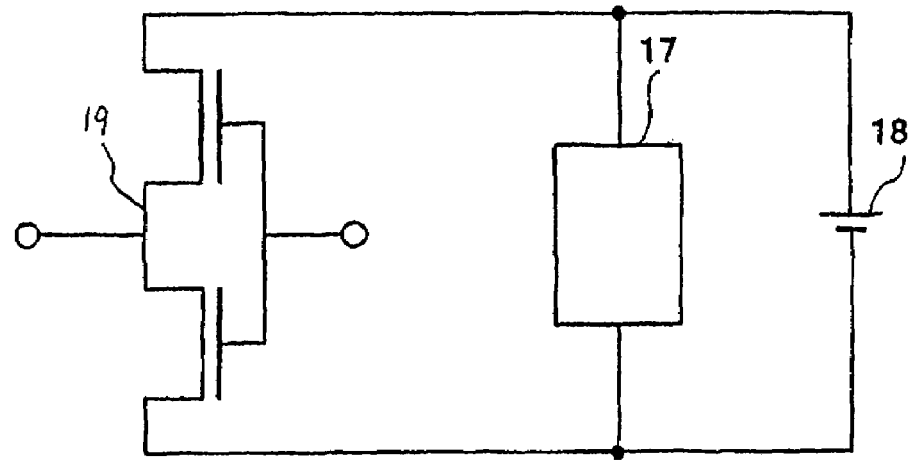
FIG. 1 is a circuit diagram representing a structure of the best mode of the semiconductor device according to the present invention.
Figure 2:
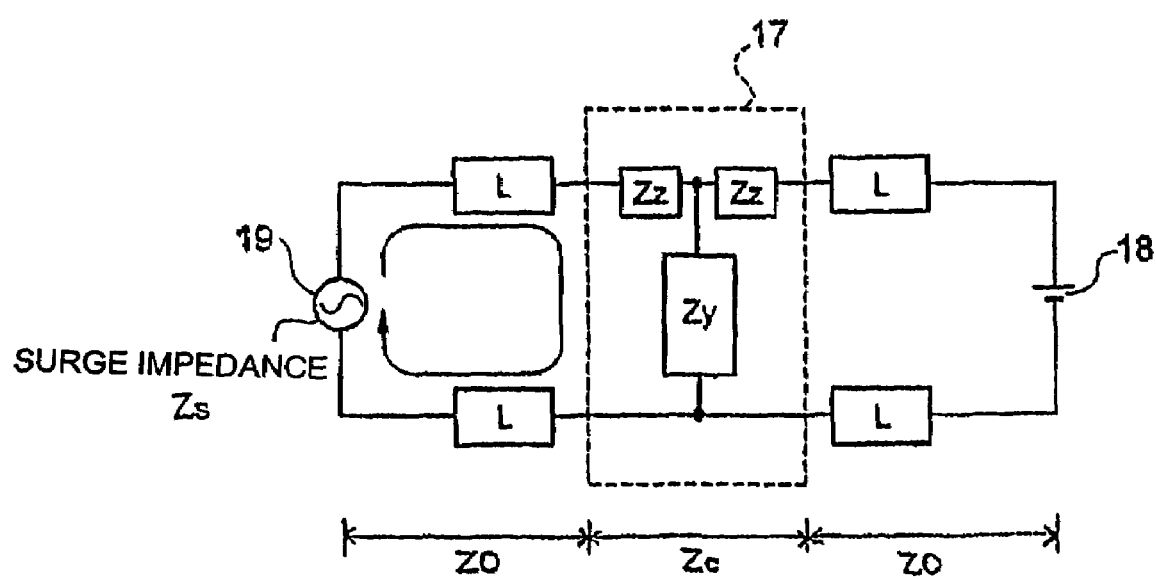
FIG. 2 is a circuit diagram representing an equivalent circuit of the transmission line element shown in FIG. 1.

FIG. 1 is a circuit diagram illustrating the most desirable configuration of the semiconductor device according to the present invention and FIG. 2 is a circuit diagram representing an equivalent circuit of the transmission line element shown in FIG. 1.

As is shown in FIG. 1, the semiconductor device of the present invention has a structure such that a transmission line element 17 having a capacitive characteristic is inserted between a power supply wiring for supplying a power supply current from a DC power supply 18 to switching element (for example, CMOS (Complementary Metal Oxide Semiconductor) inverter) 19 and the ground potential wiring. Transmission line element 17 is arranged in the nearest possible position to switching element 19 to allow a high frequency current created in switching element 19 to flow in the close vicinity of switching element 19. For reference, while FIG. 1 represents the power supply wiring and the ground potential wiring directly connected through transmission line element 17, actual transmission line element 17 flows only a high frequency current between the power supply and ground potential wirings through a capacitor but flows neither a DC current nor a signal current of a relatively low frequency.

As represented in FIG. 2, characteristic impedance Zc of transmission line element 17 is represented in terms of impedance component Zz inserted in series between DC power supply 18 and switching element 19 and impedance component Zy inserted in parallel with DC power supply 18. In addition, surge impedance Zs of switching element 19 is presumed as unknown. Further, characteristic impedance Zo of the power supply wiring depends on inductance L connected in series between DC power supply 18 and switching element 19 and the value of Zo is estimated to be several tens to several hundreds Ω in the frequency region intended for decoupling.

Figure 3:
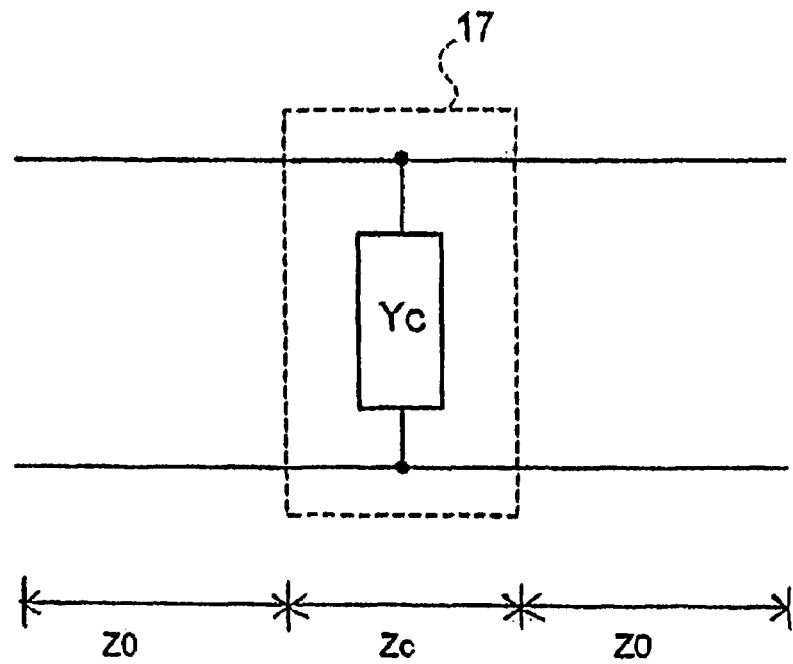
FIG. 3 is a circuit diagram obtained by substituting a parallel admittance for the equivalent circuit of the transmission line element shown in FIG. 2.

FIG. 3 is a circuit diagram in which the equivalent circuit of the transmission line element shown in FIG. 2 is substituted with parallel admittance Yc. For reference, FIG. 3 is a figure of the circuitry simplified by neglecting impedance Zz connected in series between DC power supply 18 and switching element 19 shown in FIG. 2.

The transmission characteristic of the circuit shown in FIG. 3 is represented by scattering matrix [S] shown in mathematical expression (1) below, $$[S] = \frac{1}{Y'_c + 2}\begin{bmatrix} -Y'_c & 2 \\ 2 & -Y'_c \end{bmatrix} = \begin{bmatrix} S_{11} & S_{12} \\ S_{21} & S_{22} \end{bmatrix} \quad (1)$$

where Yc'=Yc/Yo, Yo=1/Zo and Yc=1/Zc.

The reflection coefficient Γ and the transmission coefficient T of the circuit viewed from the signal input terminal in FIG. 3 (on the observer's left side of the figure=on the side of the switching element) can be represented by elements S11 and S21 of the above scattering matrix [S].

$$\Gamma = S_{11} = \frac{-Y'_c}{Y'_c + 2} = \frac{-1}{2(Z_c/Zo) + 1} \quad (2)$$

$$T = S_{21} = \frac{2}{Y'_c + 2} = \frac{2(Z_c/Zo)}{2(Z_c/Zo) + 1} \quad (3)$$

where, if (impedance Zo of the power supply wiring)>> (impedance Zc of transmission line element), then reflection coefficient Γ=−1, transmission coefficient T=0, and thus the high frequency current generated in switching element 19 will not propagate through the power supply wiring to flow into DC power supply 18.

The present invention forms a transmission line element on the semiconductor chip, in the lead, or in the power supply wiring on the print-circuit board and thereby provides the decoupling performance to the power supply wiring including the transmission line by setting the characteristic impedance of the transmission line element to an optimum value for the high frequency range through increasing the capacitance per unit length.

The transmission line element is formed through an arrangement such that, for example, a substrate (an electric conductor of polysilicon, metal, etc.) to which the ground potential is to be applied and the wiring through which the power supply current flows are arranged on differing layers across an insulating film. For increasing the capacitance per unit length of the above transmission line element, the following approaches can be intended:

1. The insulating film provided between the wiring and the ground potential is thinned.

2. A material of a high dielectric constant is employed as an insulating film.

3. A surface area is enlarged by forming a wiring in a serpentine-curved shape, or creating corrugations on a surface of the wiring. These three approaches can be applied in combination.

The effective transmission line length of transmission line element 17, is set to be longer than one fourth of the wavelength $((\lambda/4)/\epsilon^{1/2})$ that corresponds to the lowest frequency (hereinafter referred to as the lowest decoupling frequency) in the frequency range intended for the decoupling. As a result of this setting, the characteristic impedance of transmission line element 17 is represented as $(L/C)^{1/2}$ independent of a frequency in the frequency range intended for decoupling, wherein $\lambda$ stands for the wavelength corresponding the minimum frequency, $\epsilon$ for a specific dielectric constant of the insulating film, L for an inductance per unit length of transmission line element 17 and C for a capacitance per unit length of transmission line element 17.

In addition, it is necessary in order to enable the decoupling performance over a wide frequency range to lengthen the effective length of transmission line element 17. It is desirable, however, to restrain an increase in a layout area of the transmission line to the minimum from the view of realization of downsizing and highly densifying a semiconductor device. For this reason, in the present invention, transmission line element 17 is formed in a serpentine-curved pattern, or to have corrugations on the surface while keeping the distance between the ground and power supply wirings constant, thereby enabling increase in the wiring width and length without increasing the layout area of the transmission line.

In addition, the present invention implements the transmission line element on a semiconductor chip, wherein the transmission line element is configured to have a capacitive characteristic for the highest frequency of the high frequencies generated by the switching element on the semiconductor chip.

Further, the present invention implements the transmission line element on the lead of a semiconductor device, wherein the transmission line element has a capacitive characteristic for a substantially low frequency range than the case with the transmission line element implemented on a semiconductor chip.

Alternatively, the present invention implements the transmission line element on a print-circuit board, wherein the transmission line element has a capacitive characteristic for a substantially low frequency range than the case with the transmission line element implemented on a lead of a semiconductor device.

The semiconductor circuit according to the present invention is mounted with a plurality of transmission line elements having different effective frequency zones arranged in a plurality of locations such as locations of a chip and a lead of a semiconductor device or a printed-circuit board in a distributed configuration in order to widen the frequency range intended for the decoupling performance and also to realize high-density deployments in a semiconductor device. In this case, it is desirable to set the characteristic impedance of each transmission line element such that a voltage variation of DC power supply is 5% or less.

Furthermore, it is necessary to configure the insulating film to have a dielectric loss to some extent in order to prevent the incident wave on the transmission line element from externally leaking. This dielectric loss in the insulating film is preferably as large as the heat consumption of the electromagnetic wave incident on the transmission line element The present invention offers a decoupling circuit having good decoupling performance up to the frequency range higher than the conventional case by adopting the transmission line element having the above-described structure as a decoupling circuit. As a result, the high frequency noises, which transmit from the switching element to the DC power supply via the power supply wiring, are restrained, whereby the electromagnetic interference is reduced and also the distortion in a signal waveform caused by the high frequency noises produced in the switching element is reduced.

Embodiment

Explanation is next presented regarding an embodiment of the present invention with reference to the drawings.

Explanation first regards the relation between the characteristic impedance of the transmission line element and an element S21 of the scattering matrix [S] (transmission coefficient T).

Figure 4:
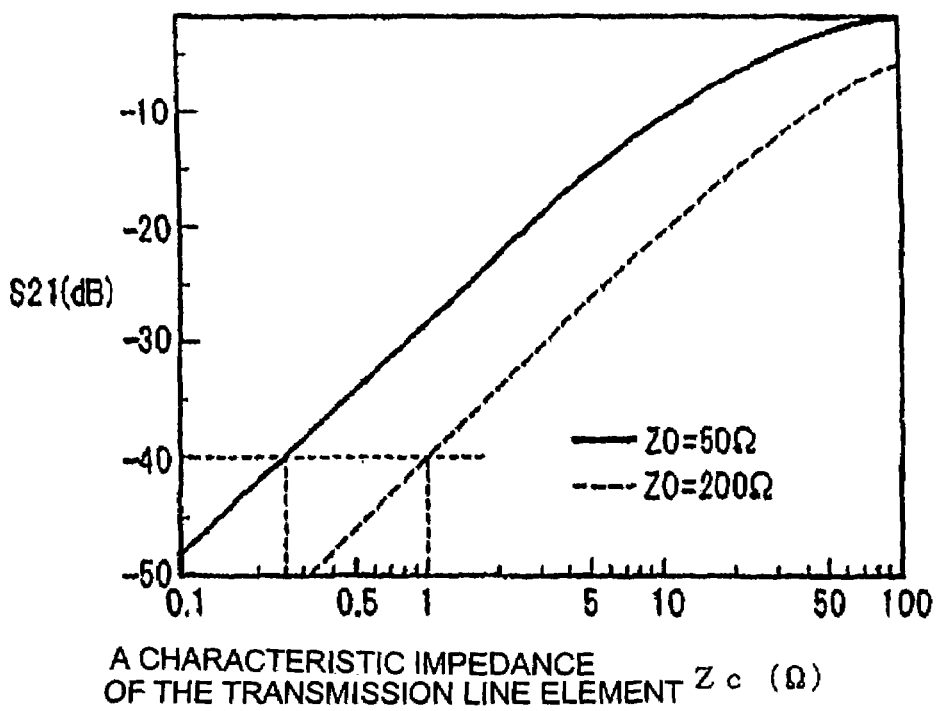
FIG. 4 is a graph representing the relation between the characteristic impedance of the transmission line element and the value of an element S21 of the scattering matrix [S]

FIG. 4 is a graph representing the relation between the characteristic impedance of the transmission line element and an element S21 of the scattering matrix [S]. For reference, FIG. 4 represents the examples in which the characteristic impedances Zo equal 50 Ω and 100 Ω, respectively.

While the value of a characteristic impedance of a power supply wiring Z0 generally depends on whether the wiring is formed on a printed-circuit board or it is formed on a chip of a semiconductor device, the characteristic impedance can be set to the level of approximately 50 Ω to 200 Ω. Further, current digital circuits require the value of S21 to be no more than −40 dB for the decoupling performance.

As shown in FIG. 4, in the case where the characteristic impedance of the power supply wiring Zo=50 Ω, which is a severe condition, it is necessary to make the characteristic impedance of the transmission line element Zc no more than 0.3 Ω in order to have S21 no more than −40 dB.

Figure 5:
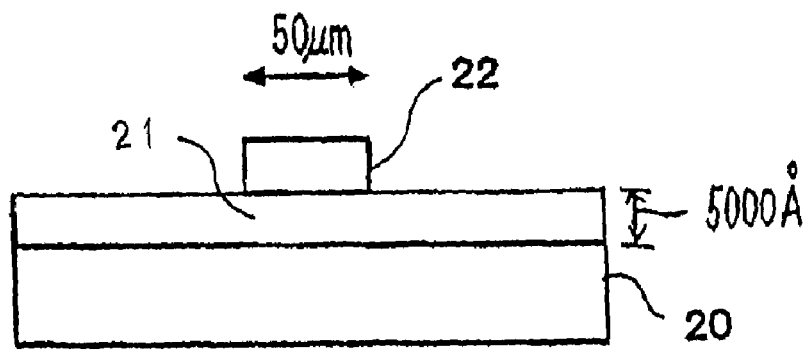
FIG. 5 is a cross-sectional view illustrating the typical structure of the wiring formed in a semiconductor device.

FIG. 5 is a cross-sectional view typically illustrating the structure of the wiring formed in a semiconductor device.

As shown in FIG. 5, the transmission line formed in a semiconductor device is configured such that insulating film (oxide film) 21 is formed on ground substrate 20 and wiring 22 is formed on insulating film 21. Wiring 22 is formed using, for example, aluminum and is 1 mm in wiring length and approximately 50 μm in width. In addition, insulating film 21 is formed about 5000 Å in film thickness using, for example, $SiO_2$ having a specific dielectric constant of about 4. Ground substrate 20 is formed of, for example, polysilicon doped with impurities at a high concentration and having a resultant reduced resistance. Characteristic impedance Zc of the transmission line formed of the above-described ground substrate 20, insulating film 21 and wiring 22 is about 50 Ω.

Accordingly, in order to make the characteristic impedance Zc of the transmission line element 0.3 Ω or smaller, it is necessary to reduce the characteristic impedance to about 1/170 and increase the capacitance per unit length to 30,000 times for the example of the structure shown in FIG. 5.

Explanation below regards embodiments of the present invention.

First Embodiment

Explanation is first given regarding a first embodiment of the semiconductor device according to the present invention.

Figure 6:
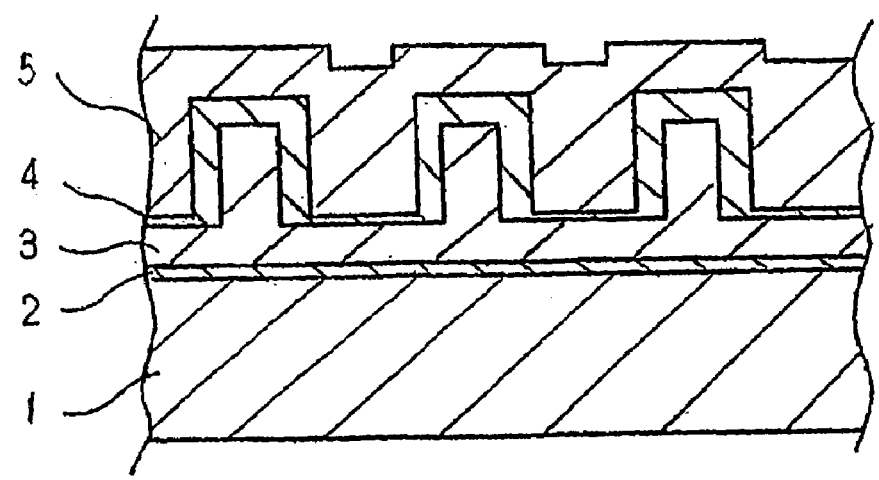
FIG. 6 is a cross-sectional side view illustrating a structure of the first embodiment of the semiconductor device according to the present invention.

FIG. 6 is a cross-sectional side view illustrating a structure of the first embodiment of the semiconductor device according to the present invention.

As represented in FIG. 6, the semiconductor device of the first embodiment has a structure in which there are provided silicon substrate 1, silicon oxide film 2 formed on silicon substrate 1, polysilicon 3 doped with high concentration impurities formed on silicon oxide film 2, insulating film 4 of a high specific dielectric constant formed of, for example, $LaAlO_3$ film provided on polysilicon 3 and wiring 5 formed of, for example, aluminum provided on insulating film 4.

For reference, the direction of transmission of a signal carried by wiring 5 in FIG. 6 is taken in the direction perpendicular to the surface of the page.

The transmission line element of the first embodiment has insulating film 4 formed of about 10 Å thick $LaAlO_3$ film having a specific dielectric constant of about 24 with polysilicon 3, insulating film 4 and wiring 5 formed in a corrugated pattern, whereby the width of the wiring is increased to about 10 times and also the capacitance per unit length is increased to about 30,000 times as compared with the general example of structure shown in FIG. 5 without changing the layout area of the transmission line. For reference, the thickness of insulating film 4 is kept constant by keeping the distance between polysilicon 3 and wiring 5 constant.

Explanation is next presented regarding the method of fabricating the semiconductor device of the first embodiment.

Figure 7:
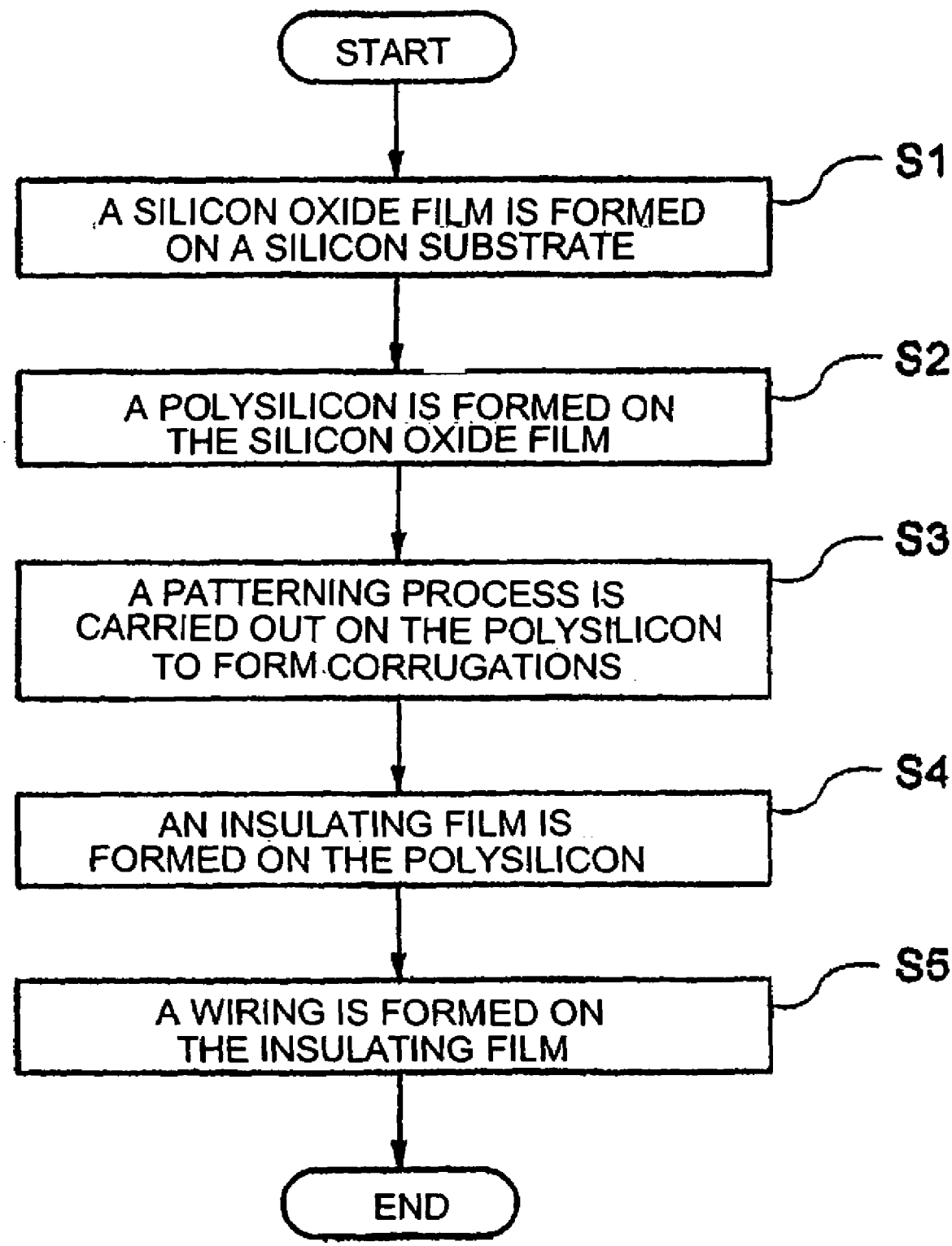
FIG. 7 is a flow chart representing the method of fabricating the semiconductor device of the first embodiment.

FIG. 7 is a flow chart representing the method of fabricating the semiconductor device of the first embodiment.

As is represented in FIG. 7, in the first embodiment, silicon oxide film 2 is first formed on silicon substrate 1 (Step S1), polysilicon 3 is formed on silicon oxide film 2, and polysilicon 3 is processed to reduce resistance to the level of metal by implantation of impurities such as phosphorus (Step S2).

Next, patterning process is carried out on polysilicon 3 through the well-known photolithography to form corrugations (Step S3). Subsequently, insulating film 4 made of $LaAlO_3$ film is formed in about 10 Å thickness on polysilicon 3 (Step S4) and finally wiring 5 made of aluminum is formed on insulating film 4 (Step S5).

Second Embodiment

Figure 8:
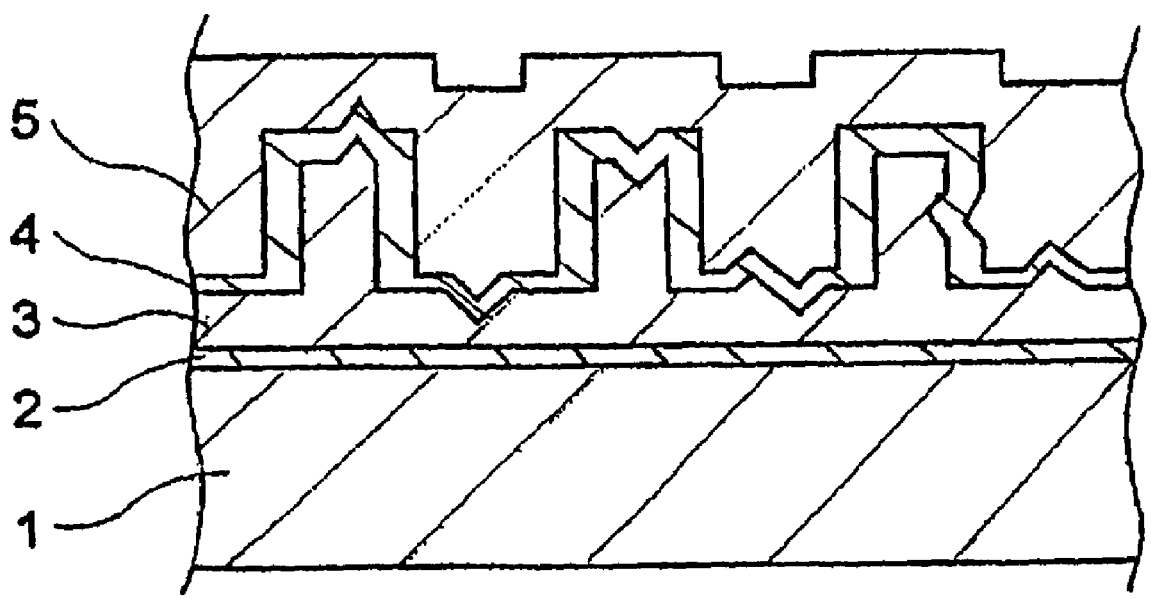
FIG. 8 is a cross-sectional side view illustrating the structure of the second embodiment of the semiconductor device according to the present invention.

FIG. 8 is a cross-sectional side view illustrating the structure of the second embodiment of the semiconductor device according to the present invention.

As represented in FIG. 8, the semiconductor device of the second embodiment has a structure in which there are provided silicon substrate 1, silicon oxide film 2 formed on silicon substrate 1, polysilicon 3 doped with high concentration impurities, insulating film 4 of a high specific dielectric constant formed of, for example, $LaAlO_3$ film provided on polysilicon 3 and wiring 5 formed of, for example, aluminum provided on insulating film 4, just like the semiconductor device of the first embodiment.

The transmission line element of the second embodiment has insulating film 4 formed of about 10 Å thick $SrTiO_3$ film having a specific dielectric constant of about 16 with the contact surfaces of the polysilicon 3 and insulating film 4 and the contact surfaces of the insulating film 4 and wiring 5 formed in a corrugated pattern, the contact surfaces being modified by finer ridges and depressions, whereby the width of the wiring is increased to about 10 times and also the capacitance per unit length is increased to about 40,000 times as compared with the general example of structure shown in FIG. 5 without changing the layout area of the transmission line.

Explanation next regards the method of fabricating the semiconductor device of the second embodiment.

Two fabrication methods are considered for fabricating the semiconductor device of the second embodiment. A first fabrication method is first explained with reference to FIG. 9.

Figure 9:
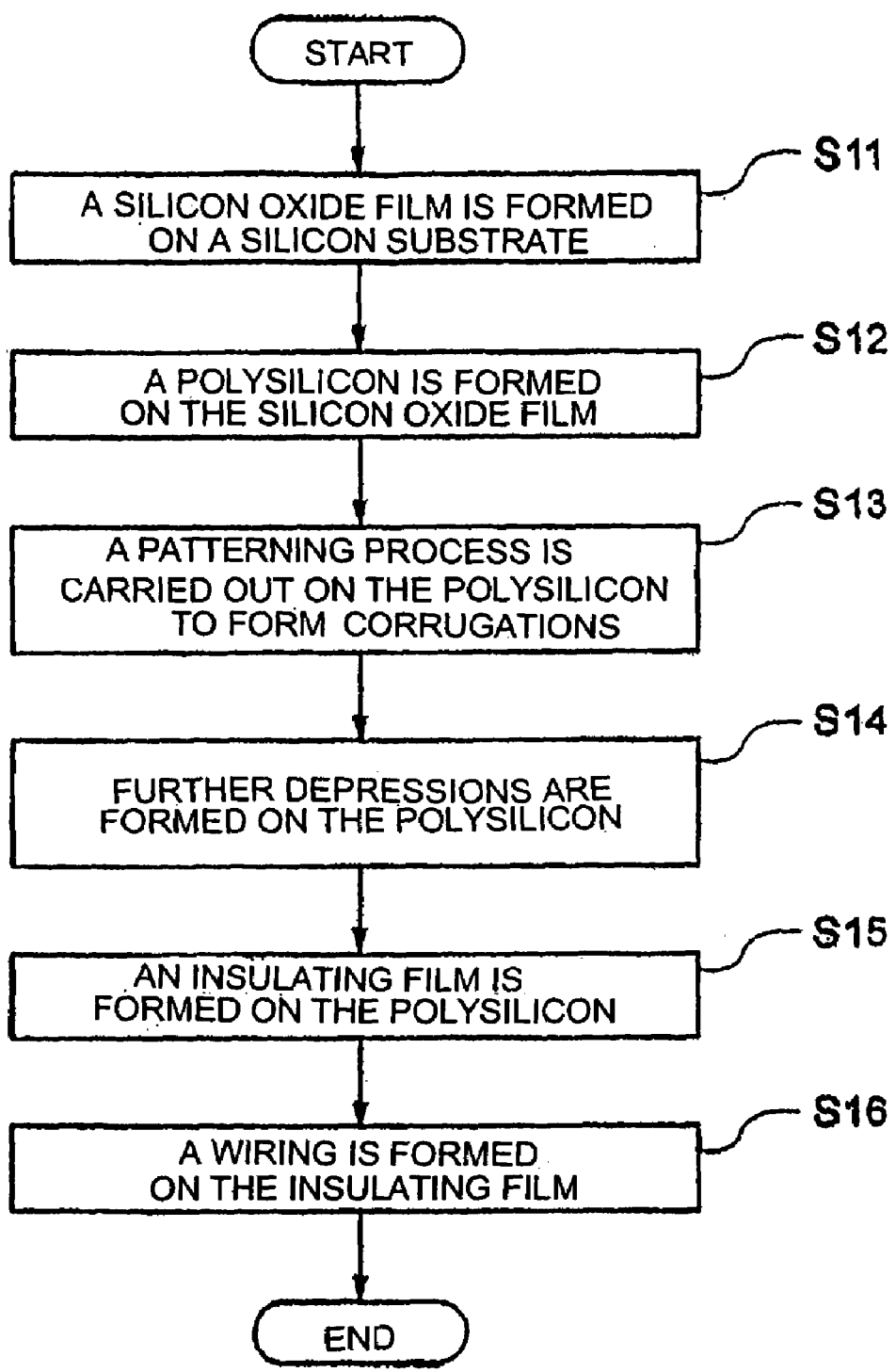
FIG. 9 is a flow chart representing the first fabricating method for fabricating the semiconductor device of the second embodiment.

FIG. 9 is a flow chart representing the first fabrication method for fabricating the semiconductor device of the second embodiment.

As shown in FIG. 9, in the first fabrication method, silicon oxide film 2 is first formed on silicon substrate 1 (Step S11), on which polysilicon 3 is formed, and the polysilicon 3 is processed to reduce the resistance to the level of metal by implanting phosphor ions etc (Step S12).

Next, patterning process is carried out on polysilicon 3 through the well-known photolithography technology to form corrugations(Step S13). Subsequently, further depressions are formed on the surface of polysilicon 3 through the method such as spraying wet etching solution (Step S14).

Next, insulating film 4 of $SrTiO_3$ is formed on polysilicon 3 (Step S15) and finally wiring 5 of aluminum is formed on insulating film 4 (Step S16).

Figure 10:
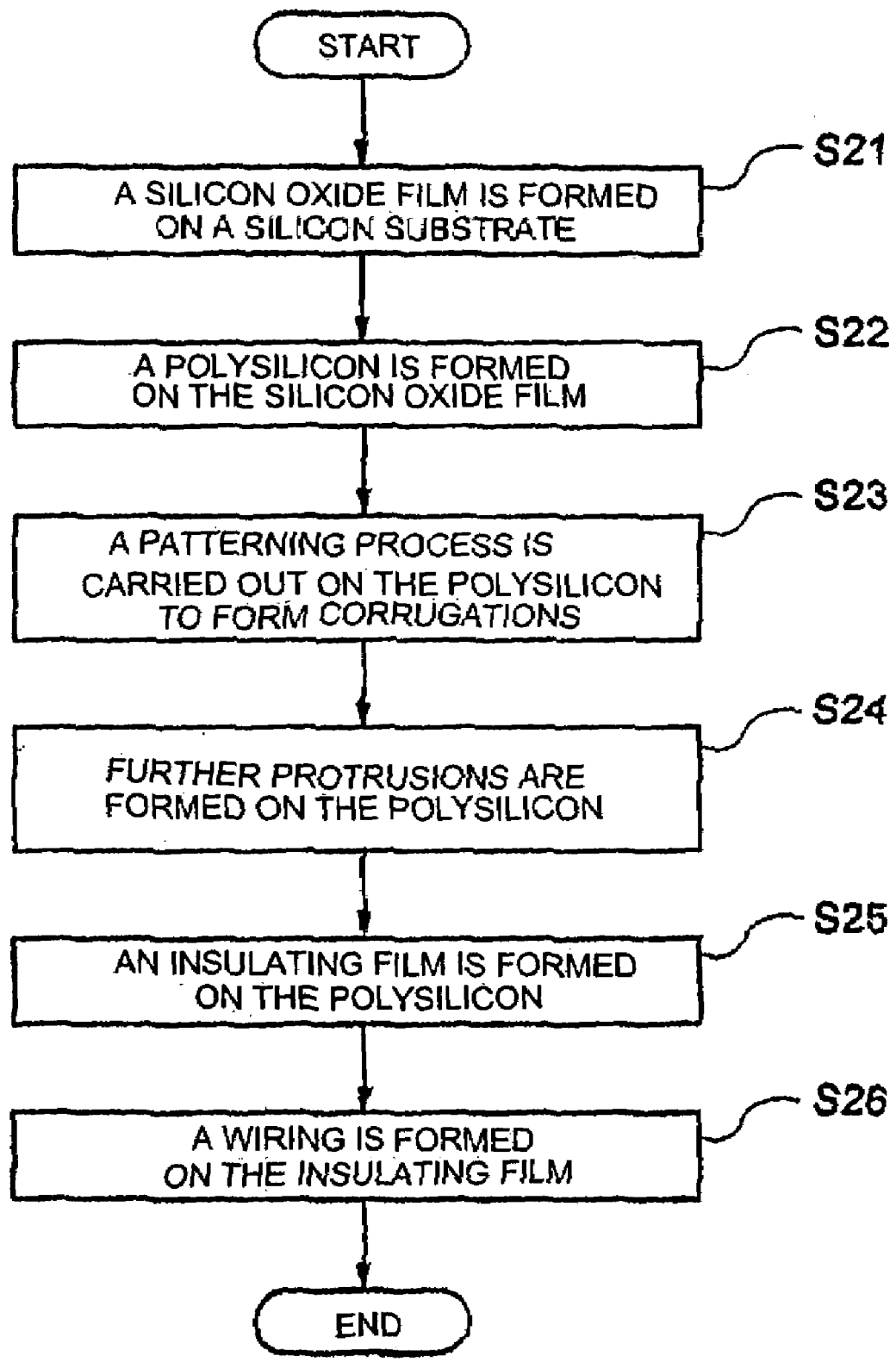
FIG. 10 is a flow chart illustrating the second method of fabricating the semiconductor device of the second embodiment.

Explanation is next presented regarding the second method of fabricating the semiconductor device of the second embodiment with reference to FIG. 10.

FIG. 10 is a flow chart illustrating the second method of fabricating the semiconductor device of the second embodiment.

As is represented in FIG. 10, in the second fabricating method, silicon oxide film 2 is first formed on silicon substrate 1 (Step S21), polysilicon 3 is formed on silicon oxide film 2, and implantation of phosphor ions etc is implemented on the polysilicon 3 to reduce the resistance of polysilicon 3 to the level of metal (Step S22).

Next, a patterning process is carried out on polysilicon 3 through the well-known photolithography technology to create corrugations (Step S23). Subsequently, silicon is locally grown on polysilicon 3 in a vapor-phase growth furnace while introducing silane (SiH4) to produce protrusions (Step S24).

Next, insulating film 4 made of SrTiO$_3$ film is formed on polysilicon 3 (Step S25), and finally wiring 5 of aluminum is formed on insulating film 4 (Step S26).

For reference, if the lowest decouplable frequency is set to 10 GHz (wavelength λ=30 mm) for the above-described transmission line made up of polysilicon 3, insulating film 4 and wiring 5, then the transmission line length is $(\lambda/4)/\epsilon^{1/2}$ or greater. The length of transmission line element is 1.5 mm or greater in the first embodiment, because LaAlO$_3$ having the specific dielectric constant of about 24 is employed for insulating film 4. Further, the length of transmission line element is 1.88 mm or greater in the second embodiment, because SrTiO$_3$ having the specific dielectric constant of about 16 is employed for insulating film 4.

Third Embodiment

Figure 11:
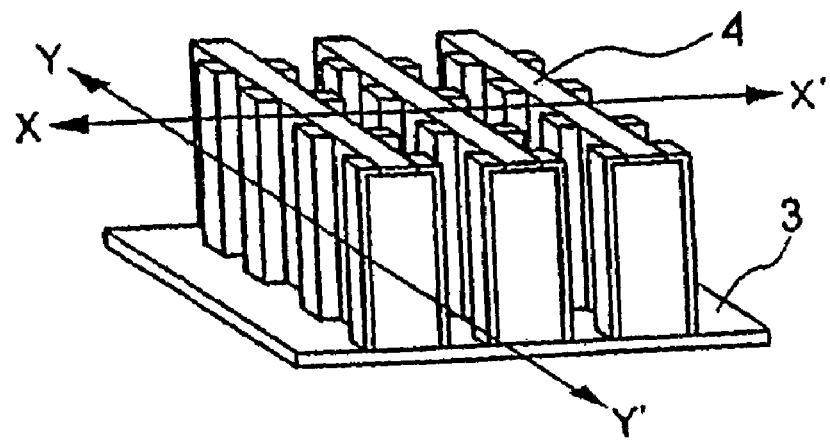
FIG. 11 is a perspective view of the polysilicon and insulating film illustrating the structure of a third embodiment of the semiconductor device of the present invention.
Figure 12:
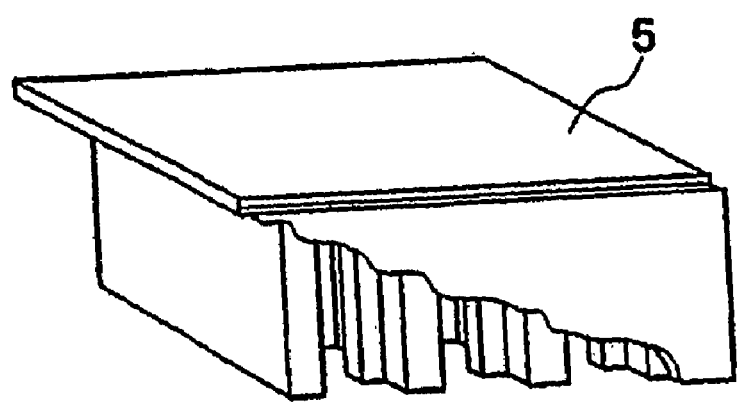
FIG. 12 is a perspective view of the wiring illustrating the structure of a third embodiment of the semiconductor device of the present invention.
Figure 13:
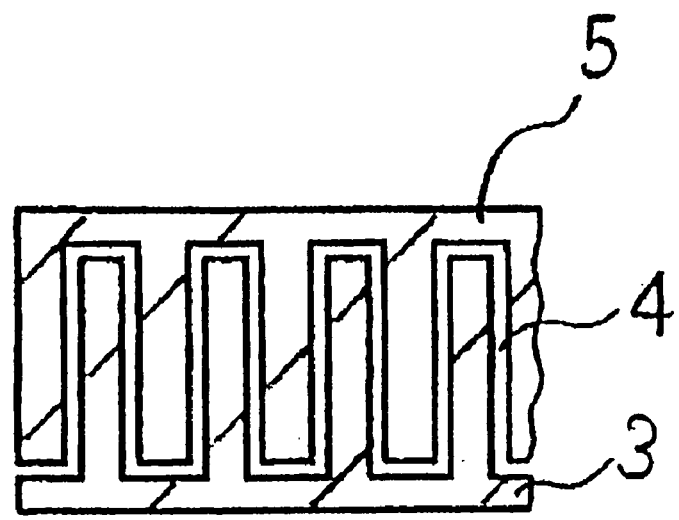
FIG. 13 is a cross-sectional view taken along an X-X' line of the semiconductor device shown in FIG. 11.
Figure 14:
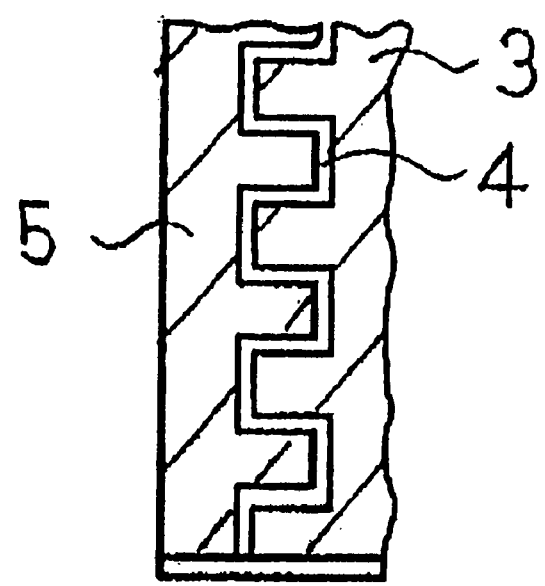
FIG. 14 is a cross-sectional view taken along a Y-Y' line of the semiconductor device shown in FIG. 11.

FIG. 11 is a perspective view of the polysilicon and insulating film illustrating a third embodiment of the semiconductor device of the present invention. FIG. 12 is a perspective view of the wiring illustrating a third embodiment of the semiconductor device of the present invention. FIG. 13 is a cross-sectional view taken along an X-X' line of the semiconductor device shown in FIG. 11. FIG. 14 is a cross-sectional view taken along a Y-Y' line of the semiconductor device shown in FIG. 11. For reference, FIG. 11 through FIG. 14 are the drawings in which silicon substrate 1 and silicon oxide film 2 are omitted from the constituent elements that make up the transmission line element.

As shown in FIG. 11 through FIG. 14, the transmission line element of the third embodiment has a structure in which polysilicon 3, insulating film 4 and wiring 5 are formed in a corrugated pattern in the direction (X-X') perpendicular to the signal transmission direction and also formed in a corrugated pattern in the signal transmission direction (Y-Y'). As a result of this structure, the wiring width and length are increased entailing an increase in a capacitance per unit length of the transmission line element without necessitating any increase in the layout area of the transmission line element, thereby widening the range of an effective decouplable frequency of the transmission line length.

Figure 15:
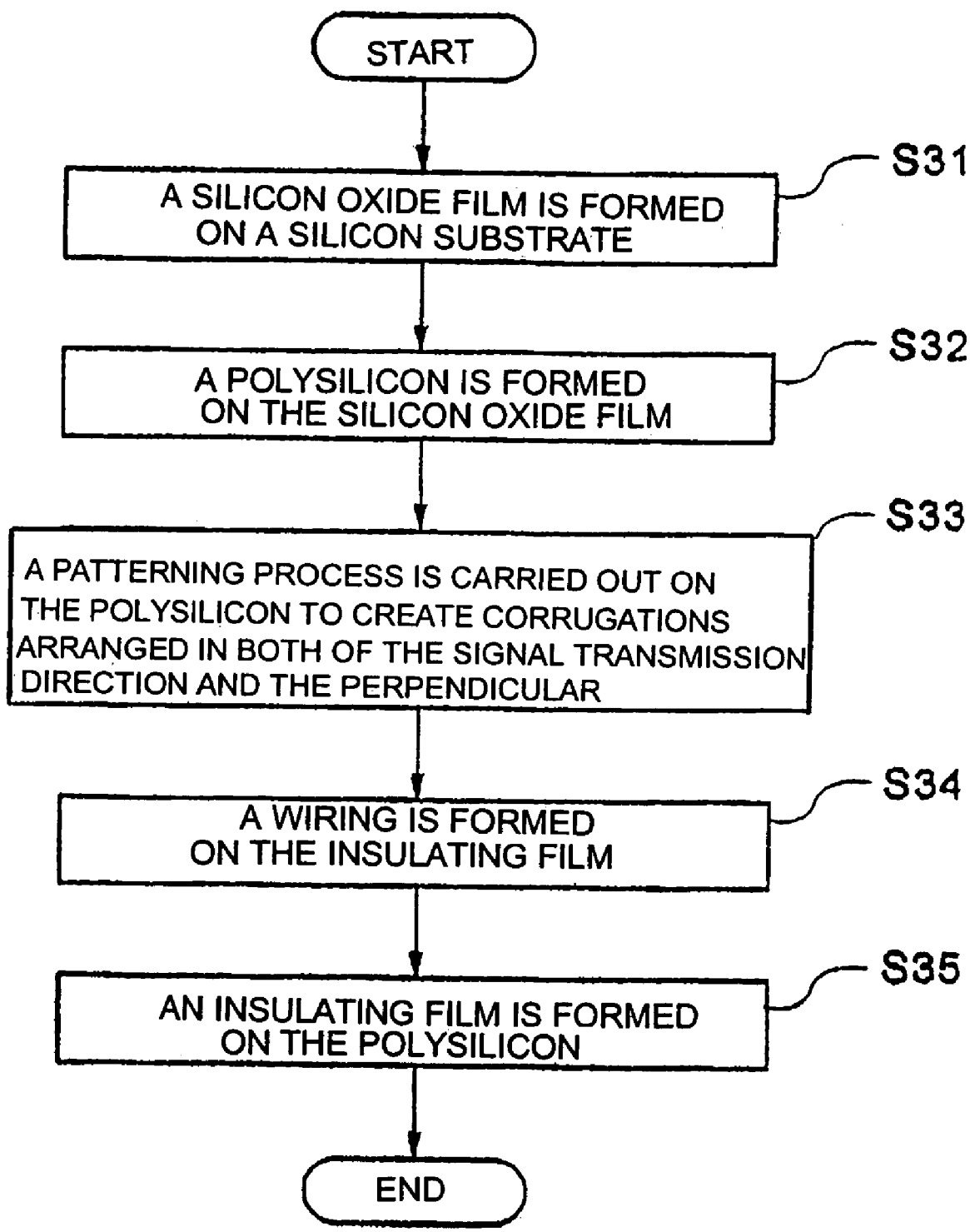
FIG. 15 is a flow chart illustrating the method of fabricating the semiconductor device of the third embodiment.

Explanation is next given regarding a method of fabricating the semiconductor device of the third embodiment with reference to FIG. 15.

FIG. 15 is a flow chart illustrating the method of fabricating the semiconductor device of the third embodiment.

As is represented in FIG. 15, in the third embodiment, silicon oxide film 2 is first formed on silicon substrate 1 (Step S31), polysilicon 3 is formed on silicon oxide film 2, and implantation of phosphor ions etc. is implemented on the polysilicon 3 to reduce the resistance of polysilicon 3 to the level of metal (Step S32).

Next, a patterning process is carried out on polysilicon 3 through the well-known photolithography technology to create corrugations arranged in both of the signal transmission direction and the direction perpendicular to the signal transmission direction (Step S33).

Next, insulating film 4 made of an LaAlO$_3$ film is formed about 10 Å in thickness on polysilicon 3 (Step S34) and finally wiring 5 of aluminum is formed on insulating film 4 (Step S34), wherein the forms of insulating film 4 and wiring 5 are corrugated in each of the signal transmission direction and the direction perpendicular to the signal transmission direction, as is the case of polysilicon 3.

It is possible in the present embodiment to increase the wiring width and wiring length to about 10 times those in the first and second embodiments without increasing the layout area of the transmission line. As a result, even if the lowest effective decouplable frequency is set to 1 GHz, i.e., 1/10 that of the first and second embodiments, a length of about 1.5 mm suffices for the length of the transmission line of the transmission line element.

Fourth Embodiment

Figure 16:
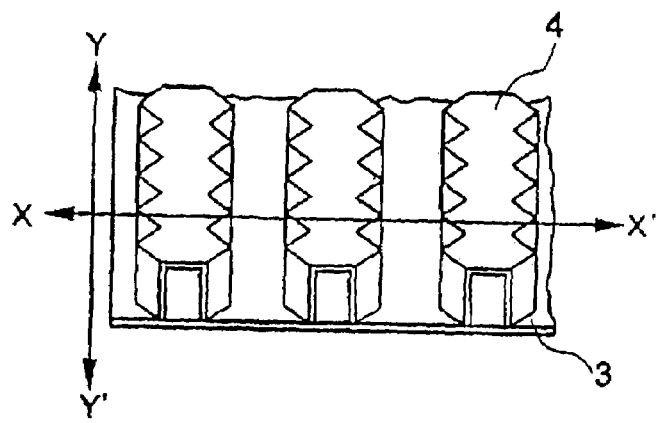
FIG. 16 is a perspective view of the polysilicon and insulating film representing the structure of the semiconductor device of the fourth embodiment according to the present invention.
Figure 17:
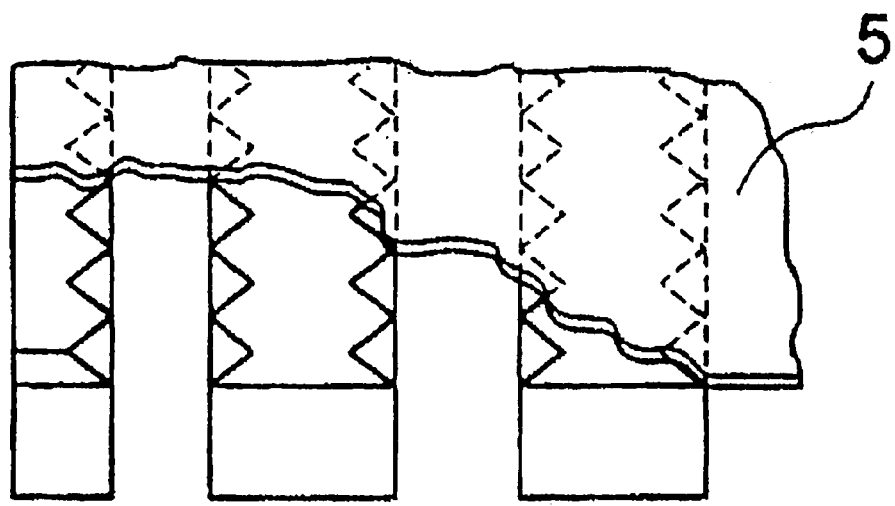
FIG. 17 is a perspective view of the wiring representing the structure of the semiconductor device of the fourth embodiment according to the present invention.
Figure 18:
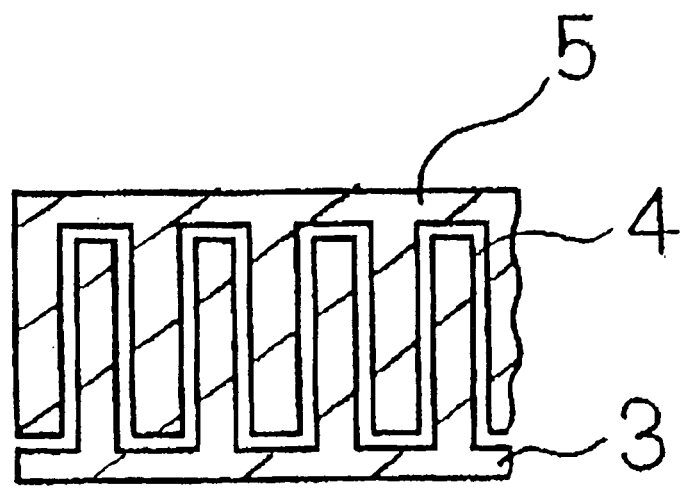
FIG. 18 is a cross-sectional view along an X-X' line of the semiconductor device shown in FIG. 16.
Figure 19:
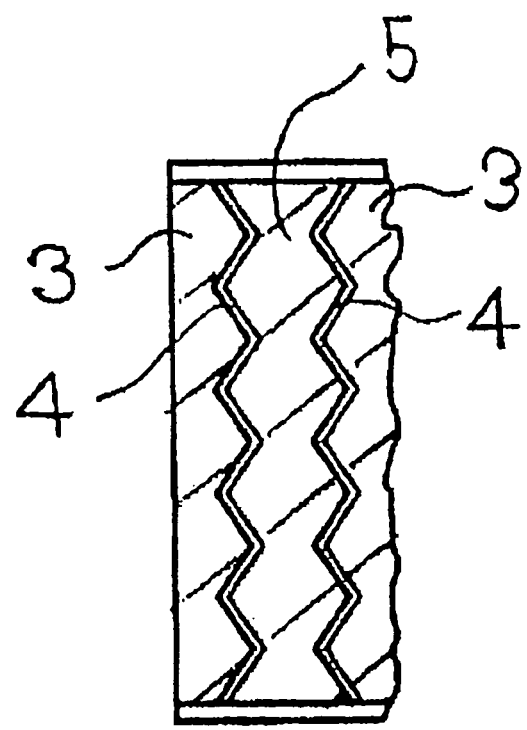
FIG. 19 is a cross-sectional view along a Y-Y' line of the semiconductor device shown in FIG. 16.

FIG. 16 through FIG. 19 are diagrams illustrating the structure of the semiconductor device of the fourth embodiment according to the present invention. FIG. 16 is a perspective view of the polysilicon and insulating film representing the structure of the semiconductor device of the fourth embodiment according to the present invention. FIG. 17 is a perspective view of the wiring representing the structure of the semiconductor device of the fourth embodiment according to the present invention. FIG. 18 is a cross-sectional view along an X-X' line of the semiconductor device shown in FIG. 16, and FIG. 19 is a cross-sectional view along a Y-Y' line of the semiconductor device shown in FIG. 16. For reference, FIG. 16 through FIG. 19 are the drawings in which silicon substrate 1 and silicon oxide film 2 are omitted from the constituent elements that make up the transmission line element.

As shown in FIG. 16 through FIG. 19, the transmission line element of the fourth embodiment has a structure in which polysilicon 3, insulating film 4 and wiring 5 are formed so as to have corrugations arranged in the direction (X-X') perpendicular to the signal transmission direction with each corrugation being worked to have a plurality of ridges in the side surface. As a result of this structure, the wiring width is increased entailing an increase in a capacitance per unit length of the transmission line without necessitating any increase in the layout area of the transmission line, thereby widening the range of an effective decouplable frequency of the transmission line element, just like the third embodiment.

Figure 20:
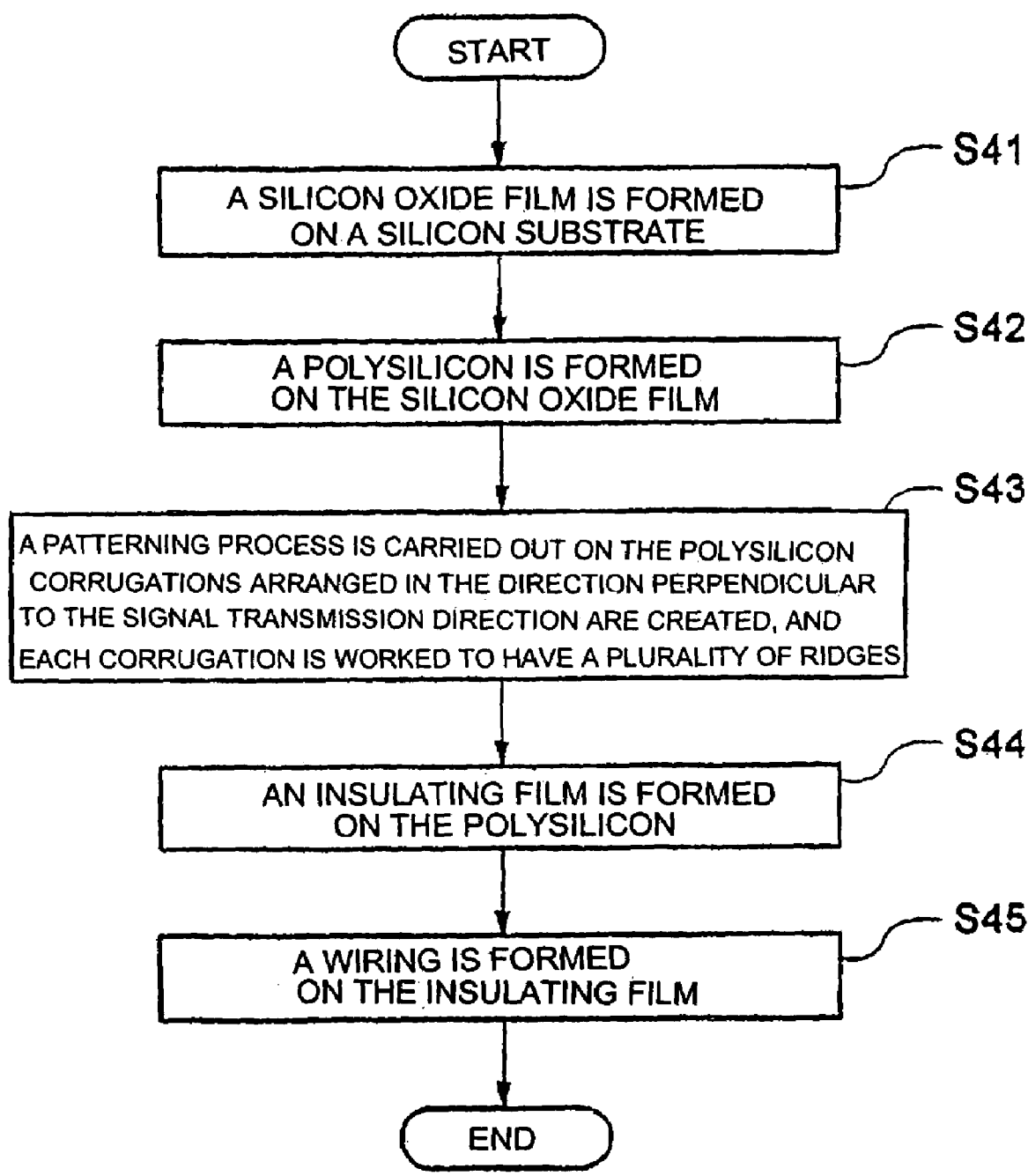
FIG. 20 is a flow chart illustrating the method of fabricating the semiconductor device of the fourth embodiment.

Explanation is next given regarding the method of fabricating the semiconductor device of the fourth embodiment with reference to FIG. 20.

FIG. 20 is a flow chart illustrating the method of fabricating the semiconductor device of the fourth embodiment.

As is represented in FIG. 20, in the fourth embodiment, silicon oxide film 2 is first formed on silicon substrate 1 (Step S41), polysilicon 3 is formed on silicon oxide film 2, and implantation of phosphor ions etc. is implemented on the polysilicon 3 to reduce the resistance thereof to the level of metal (Step S42).

Next, a patterning process is carried out on polysilicon 3 through the well-known photolithography technology, corrugations arranged in the direction perpendicular to the signal transmission direction are created, and each corrugation is worked to have a plurality of ridges (Step S43).

Next, insulating film 4 made of an LaAlO$_3$ film is formed about 10 Å thick on polysilicon 3 (Step S44) and finally wiring 5 of aluminum is formed on insulating film 4 (Step S45), wherein the forms of insulating film 4 and wiring 5 are corrugated in the direction perpendicular to the signal transmission direction and their side surface have a plurality of ridges, just like polysilicon 3.

It is possible in the present embodiment as well to increase the wiring width to about 10 times that of the first and second embodiments without increasing the layout area of the transmission line. As a result, even if the lowest effective decouplable frequency is set to 1 GHz, i.e., 1/10 that of the first and second embodiments, a length of about 1.5 mm suffices for the length of the transmission line of the transmission line element.

For reference, the transmission line elements illustrated in the first though fourth embodiments allow an increase in the wiring width or wiring length without increasing the layout area of the transmission line as well if it is configured so as to set the direction of transmitting a signal in the direction different by 90 degrees (i.e., in a horizontal direction with respect to the page, or in the X-X' direction). Thus, it is possible to obtain the same advantage as described above.

Further, if the transmission line element is made longer in order to attain decoupling performance for a lower frequency and consequently becomes unable to be mounted on the semiconductor chip, then it is possible to implement the transmission line element, described in connection to the above-described first through fourth embodiments, on a printed-circuit board or a lead of a package. In this regard, however, it is preferred to arrange the transmission line element near the switching element to result in less degradation in the decoupling performance.

Thus, it is preferred to implement the transmission line elements in a plurality of locations on a chip and a lead of a semiconductor device, or a printed-circuit board etc. depending on the size in order to widen the frequency zone intended for decoupling and also to realize high-density integration of a semiconductor device.

Fifth Embodiment

The semiconductor device of the fifth embodiment is configured such that the transmission line element exemplified in each of the above-described first through fourth embodiments is implemented on a lead of a semiconductor device.

Explanation first regards a general structure of a package of a semiconductor device.

Figure 21:
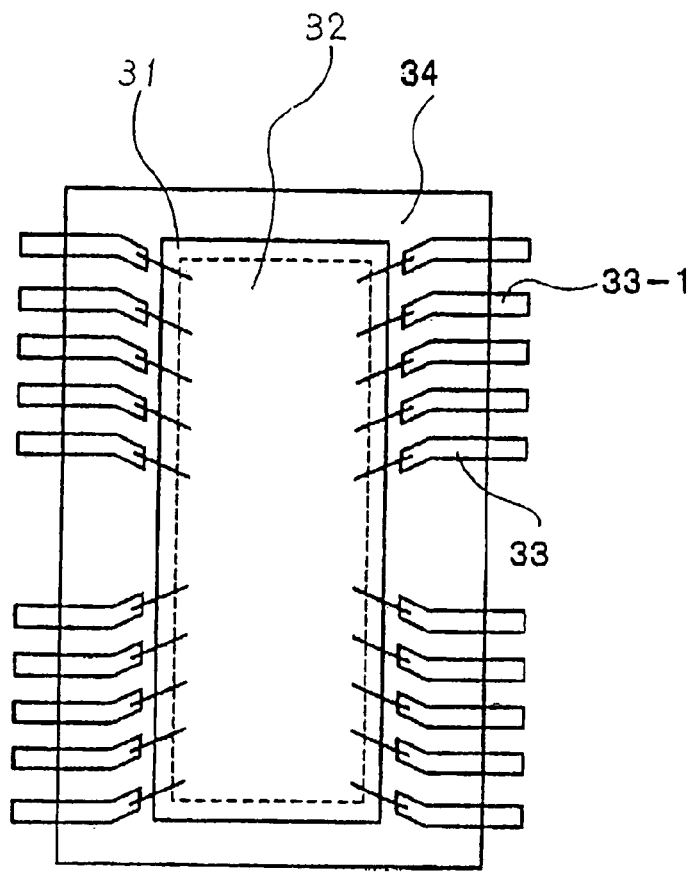
FIG. 21 is a plan view illustrating an example of the structure of a package of the semiconductor device.

FIG. 21 is a plan view illustrating an example of the structure of a package of the semiconductor device.

As illustrated in FIG. 21, the semiconductor device has a structure having semiconductor chip 32, on which circuits are formed, fixed to die pad section 31 by means of mounting material. Internal pads (not shown) are formed on the surface of semiconductor chip 32, and the internal pads are connected respectively with a plurality of leads 33 arranged around the periphery of die pad 31 through the use of bonding wires. Die pad 31, semiconductor chip 32, bonding wires and parts of leads are sealed by resin mold layer 34.

In the present embodiment, the transmission line element described in any of the above-described first through fourth embodiments is implemented on lead for a power supply wiring (hereinafter, referred to as a power supply lead) 33-1 of a plurality of leads 33 shown in FIG. 21.

Figure 22:
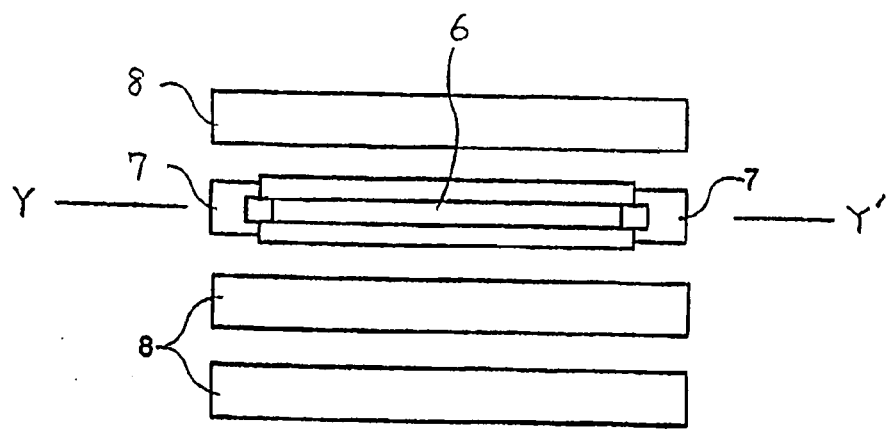
FIG. 22 is an enlarged view illustrating the principal structure of the fifth embodiment of the semiconductor device according to the present invention.

FIG. 22 is an enlarged view illustrating the pricipal structure of the fifth embodiment of the semiconductor device according to the present invention.

FIG. 22 is a view of power supply lead 7 and other leads of the semiconductor device in an enlarged representation showing an arrangement of transmission line element 6 mounted on power supply lead 7.

Transmission line element 6 has a construction made up of polysilicon 3, insulating film (for example, $LaAlO_3$) 4, and wiring 5 as illustrated in any of the first through fourth embodiments.

Figure 23:
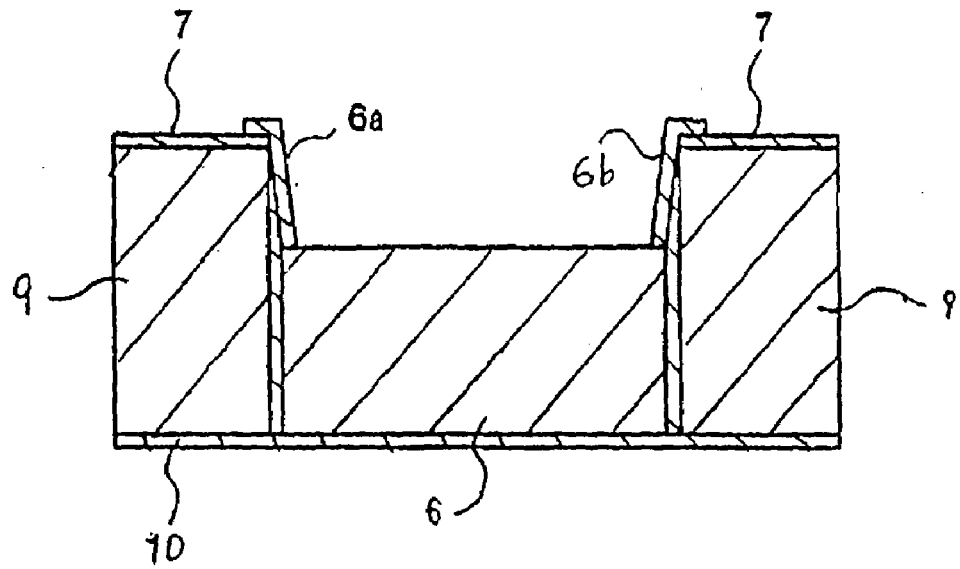
FIG. 23 is a cross-sectional view along a Y-Y' line of the semiconductor device illustrated in FIG. 22.

FIG. 23 is a cross-sectional view along a Y-Y' line of the semiconductor device illustrated in FIG. 22.

As shown in FIG. 23, the semiconductor device of the present embodiment has a construction in which transmission line element 6 is formed on metal ground (ground potential) surface 10 fixed to, for example, a package of a semiconductor device and epoxy resin layers 9 are formed on ground surface 10 so as to sandwich transmission line element 6 of interest.

Power supply lead 7 is formed on each of epoxy resin layers 9, and transmission line element 6 and the end of power supply lead 7 on each of epoxy resin layers 9 are connected through end line 6a, 6b. Transmission line element 6 of the present embodiment is formed thinner than epoxy resin layers 9. Consequently, transmission line element 6 formed thinner than insulating film 4 yields a large capacitance of transmission line element 6. For reference, FIG. 23 represents an arrangement in which lead 8 is omitted.

Explanation next regards the method of fabricating the semiconductor device of the fifth embodiment.

Figure 24:
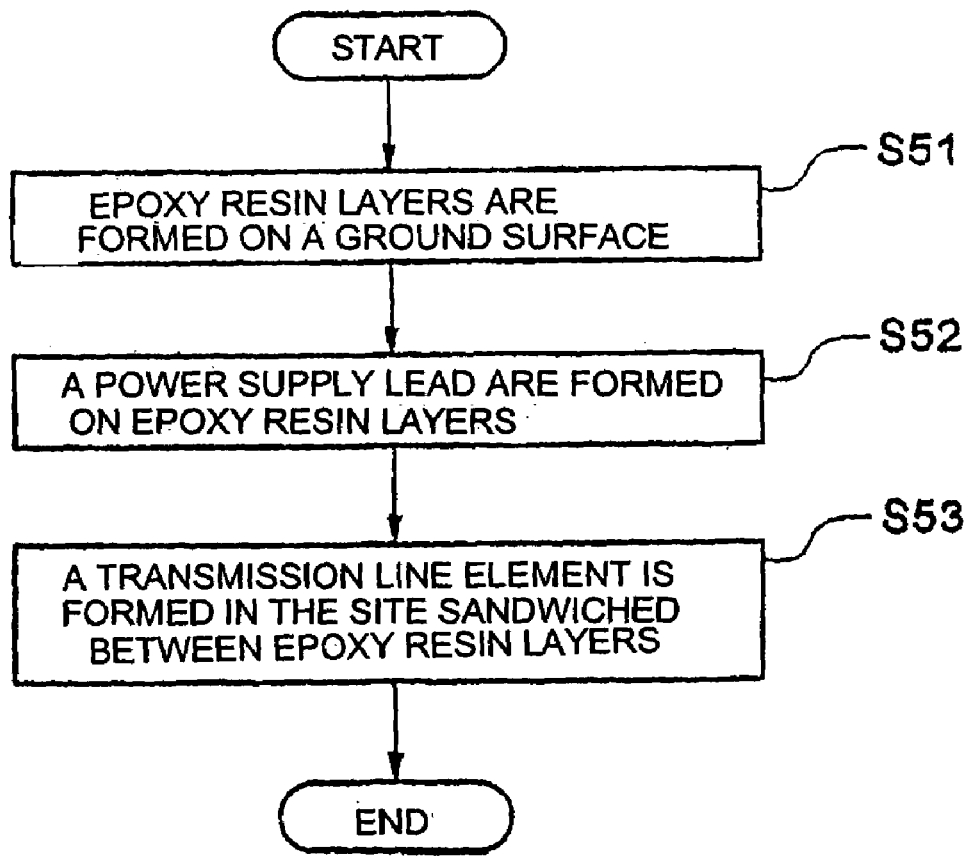
FIG. 24 is a flow chart illustrating the method of fabricating the semiconductor device of the fifth embodiment.

FIG. 24 is a flow chart illustrating the method of fabricating the semiconductor device of the fifth embodiment.

As represented in FIG. 24, the fifth embodiment forms first epoxy resin layers 9 having a specific dielectric constant of 4 and about 1 mm in thickness on metal ground surface 10 (Step S51).

Next, metal leads 8 (not shown) and power supply lead 7 each 1 mm wide and about 20 mm long (the length of the upper layer section only) are formed on epoxy resin layers 9 (Step S52).

Subsequently, transmission line element 6, which is thinner than epoxy resin layers 9, is formed in the site sandwiched between epoxy resin layers 9 according to the method described in any of the above-described first through fourth embodiments (Step S53). The end portion of transmission line element 6 is bonded to power supply leads 7 formed on epoxy resin layers 9 by solder etc. For reference, the polysilicon (ground potential wiring: not shown) of transmission line element 6 is connected to metal ground surface 10.

In this construction, if, for example, the lowest decouplable frequency of transmission line element 6 is set to 1 GHz, then the length of transmission line element 6 is about 15 mm, provided that transmission line element 6 is configured in accordance with the first embodiment, and the length is about 1.5 mm, provided that transmission line element 6 is configured in accordance with the third embodiment. Further, if the lowest decouplable frequency is set to 100 MHz, then the length of transmission line element 6 is about 150 mm, provided that transmission line element 6 is configured in accordance with the first embodiment, and the length is about 15 mm, provided that transmission line element 6 is configured in accordance with the third embodiment.

If it is assumed that the length of power supply lead 7 of the semiconductor device is 20 mm and the length of transmission line element 6 that can be mounted on the lead of interest is 15 mm, the decoupling effect can be expected in 1 GHz and higher through the use of transmission line element 6 described in the first embodiment and in 100 MHz and higher through the use of transmission line element 6 described in the third embodiment.

It is to be noted that, while the above explanation has been given on the presumption that metal ground surface 10 is fixed to the package of the semiconductor device, it is possible to connect the polysilicon of the transmission line element to the ground potential wiring on the print-circuit board in the case where the package lacks a ground surface.

Sixth Embodiment

The semiconductor device of the sixth embodiment has a construction in which any of the transmission line elements exemplified in the first through fourth embodiments is implemented on a lead of the semiconductor device.

Figure 25:
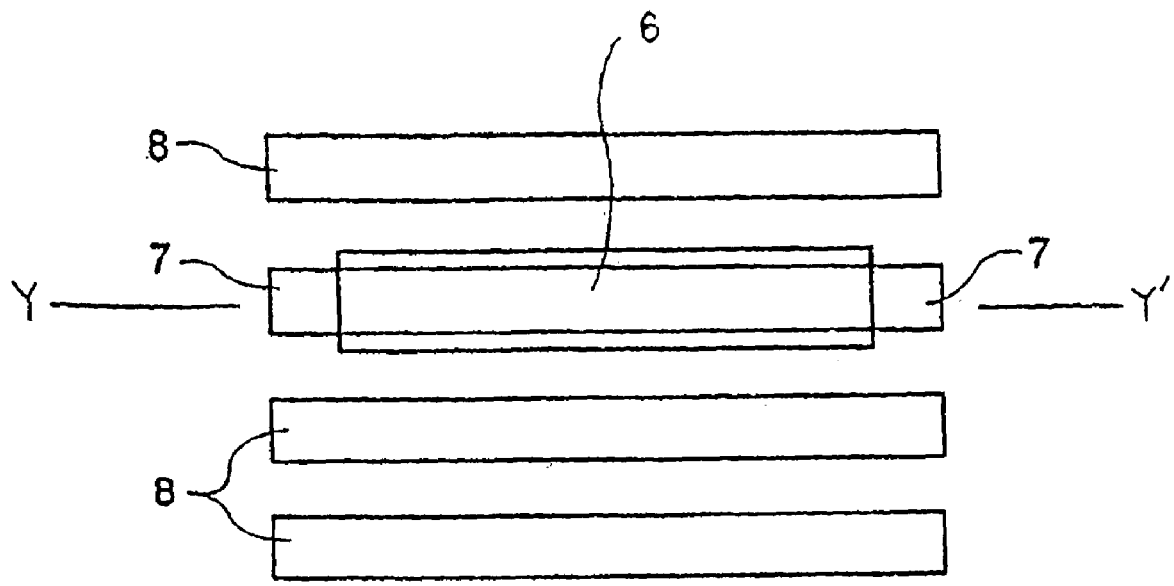
FIG. 25 is an enlarged view illustrating the principal structure of the semiconductor device of the sixth embodiment according to the present invention.

FIG. 25 is an enlarged view illustrating the principal structure of the semiconductor device of the sixth embodiment according to the present invention.

FIG. 25 is an enlarged view of power supply lead 7 and other leads 8 of the semiconductor device illustrating an arrangement of transmission line element 6 mounted on power supply lead 7.

Figure 26:
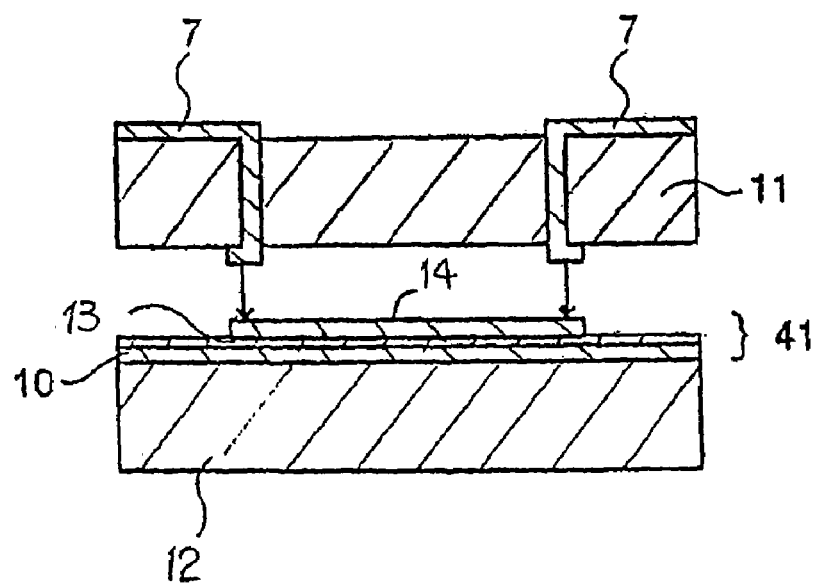
FIG. 26 is a cross-sectional view along a Y-Y' line of the semiconductor device shown in FIG. 25.

FIG. 26 is a cross-sectional view along a Y-Y' line of the semiconductor device shown in FIG. 25.

As represented in FIG. 26, the semiconductor device of the present invention is configured such that metal ground (ground potential) surface 10 is formed on ceramic substrate (insulator substrate) 12 fixed to, for example, a package of a semiconductor device and wiring 14 is formed on metal ground surface 10 through insulating film 13 of a high dielectric constant to yield transmission line element 41.

Ceramic layer (insulating film) 11 is formed on transmission line element 41, which is connected to power supply lead 7 formed on ceramic layer 11 of interest through a through-hole provided in ceramic layer 11.

Specifically, about 1 mm thick ceramic layer 11 made of alumina having a specific dielectric constant of 8 is formed on metal ground surface 10 and metal leads 8 (not shown) and two power supply leads 7 each 1 mm wide and about 20 mm long are formed on ceramic layer 11.

While in the first through fourth embodiments, the width of transmission line element is set to 50 μm, it is set to about 1 mm to accord with the width of power supply lead 7 in the present embodiment. High-dielectric-constant insulating film 13 is formed about 10 Å in thickness through the use of, for example, an LaAlO$_3$ film having a specific dielectric constant of 24.

For reference, in the present embodiment, while transmission line element 41 is not formed in a corrugated pattern, it satisfactorily clears the presumed standard, because the width of the transmission line is 20 times as compared to those of the first and second embodiments and consequently the capacitance per unit length attains about 60,000 times that of the wiring in the general case shown in FIG. 5.

In the present embodiment, if the lowest decouplable frequency of the transmission line element is prescribed to be, for example, 1 GHz, then the length of the transmission line element becomes 15 mm or longer. Wiring 14 of transmission line element 41 is connected to power supply leads 7 in both ends of wiring 14, and ground surface 10 is used in common for the ground-potential wiring of transmission line element 41.

Explanation next regards the method of fabricating the semiconductor device of the sixth embodiment.

FIG. 27 is a flow chart illustrating the method of fabricating the semiconductor device of the sixth embodiment.

As shown in FIG. 27, in the sixth embodiment, ground surface 10 formed of a metal layer is first formed on ceramic substrate 12 of alumina etc. (Step S61) and insulating film 13 about 10 Å thick formed of an LaAlO$_3$ film is formed on ground surface 10 of interest (Step S62).

Next, wiring 14 about 1 mm wide made of tungsten etc. is formed on insulating film 13 (Step S63). This piece is referred to as ceramic A.

Next, ceramic layer 11 having an opening (through-hole) formed therein is provided separately from ceramic A, and power supply leads 7 about 1 mm wide of tungsten etc. are formed to connect the top section of ceramic layer 11, the internal wall of the through-hole, and the bottom section of the through-hole (Step S64). This piece is referred to as ceramic B.

Finally, the above-described ceramic A and ceramic B are affixed together and sintered to combine integrally (Step S65). In this step, the parts of power supply leads 7 formed in the bottom portions of the through-hole provided in ceramic layer 11 are bonded to both ends of wiring 14 formed on insulating film 13.

For reference, in the above-described first to sixth embodiments, while characteristic impedance Zc of 0.3 Ω or less is preset for the design basis of the transmission line element, the characteristic impedance Zc of an actual transmission line element depends on a required decoupling performance, the construction, material of the leads and printed-circuit board of the semiconductor device. Thus, it is preferred to set optimum values depending on such conditions.

In addition, regarding the transmission line elements illustrated as examples in the above first through sixth embodiments, it is preferred to properly change the dielectric constant and thickness of the insulating film, the width and length of transmission line, the density of the corrugations, the aspect ratio of the corrugation, the shape of the corrugation, etc. according to the design basis.

Furthermore, regarding the foregoing first through sixth embodiments, while explanation of the methods of fabricating transmission line elements is given on the presumption of a silicon process, the methods are applicable to the fabrication process other than the silicon process such as gallium arsenide process.

Furthermore, the following materials can be used for the insulating film of the transmission line element: epoxy resin having the same dielectric constant of about 4 as the silicon oxide film; SiO, silicon nitride, TaO$_3$, TiO$_2$, Al$_2$O$_3$, and MgO having a specific dielectric constant of about 8; SrTiO$_3$ and ZrO$_2$ having a specific dielectric constant of about 16; LaAlO$_3$ having a specific dielectric constant of about 24; BST (titanium oxide barium strontium) having a specific dielectric constant of about 300; and PZT (lead zirconate titanate) having a specific dielectric constant of about 1000, etc.

The invention claimed is:

1. A semiconductor device comprising:
a plurality of transmission lines, formed in a semiconductor chip, each formed of a ground wiring to have the ground potential and a power supply wiring to carry a power supply current with an insulating film interposed between the ground wiring and the power supply wiring; and
a transmission line element formed in a semiconductor chip and arranged to relay said power supply current carried between said transmission lines, said transmission line element being formed of one of said ground wirings and a corresponding one of said power supply wirings with an insulating film interposed between the ground wiring and the power supply wiring and having a characteristic impedance sufficiently low as compared to the characteristic impedance of said transmission line, for reducing a high frequency noise that leaks through the power supply wirings.

2. The semiconductor device according to claim 1, wherein said transmission line element has a large capacitance per unit length such that the characteristic impedance thereof is low enough as compared to the characteristic impedance of said transmission line.

3. The semiconductor device according to claim 1, wherein the effective length of said transmission line element is a transmission line length longer than one fourth of a wavelength corresponding to the lowest frequency in the frequency range intended for decoupling.

4. The semiconductor device according to claim 1, wherein said transmission line element has said ground wiring and said power supply wiring formed in a corrugated form with a separation thereof kept at a constant distance.

5. The semiconductor device according to claim 4, wherein said transmission line element has at least either depressions or protrusions on said ground wiring, said insulating film and said power supply wiring.

6. The semiconductor device according to claim 4, wherein said transmission line element is formed in a corrugated form with corrugations arranged in a direction perpendicular to said signal transmission direction.

7. The semiconductor device according to claim 4, wherein said transmission line element is formed in a corrugated form with corrugations arranged in said signal transmission direction.

8. The semiconductor device according to claim 4, wherein said transmission line element is formed in a corrugated form with corrugations arranged both in a signal transmission direction and in a direction perpendicular to said signal transmission direction.

9. The semiconductor device according to claim 4, wherein the surfaces formed in a corrugated form of said ground wiring, said insulating film, and said power supply wiring of said transmission line element are each further formed in a form having a plurality of ridges.

10. The semiconductor device according to claim 1, further comprising:
a plurality of transmission lines implemented on power supply leads each for supplying a power supply current from an external circuit, each formed of a ground wiring to have the ground potential and a power supply wiring to carry a power supply current with an insulating film interposed between the ground wiring and the power supply wiring; and
a transmission line element implemented on power supply leads and arranged to relay said power supply current carried between said transmission lines, said transmission line element being formed of said ground wiring and said power supply wiring with a second insulating film interposed between the ground wiring and the power supply wiring, and further said transmission line element having a characteristic impedance sufficiently low as compared to the characteristic impedance of said transmission line.

11. The semiconductor device according to claim 10, further provided with a resin layer formed on a ground potential surface interposing said transmission line element, with the ends of said power supply leads being connected to said transmission line element and said power supply leads being formed on said resin layer, wherein
said transmission line element is formed thinner than said resin layer.

12. The semiconductor device according to claim 10, further comprising:
a transmission line element formed on a part of an insulating substrate of a package, and
an insulator layer mounted on said transmission line element and provided with a through-hole that passes from the top to the bottom of the insulator layer, wherein said power supply leads are formed on said top and connected to said power supply wiring of said transmission line element through said through-hole.

13. A semiconductor circuit, provided with:
a semiconductor device according to claim 10, and
a printed-circuit board on which said semiconductor device is mounted, provided with a plurality of transmission lines each formed of a ground wiring to have the ground potential and a power supply wiring to carry a power supply current with an insulating film interposed between the ground wiring and the power supply wiring, and a transmission line element arranged to relay said power supply current carried between said transmission lines, said transmission line element being formed of said ground wiring and said power supply wiring with a second insulating film interposed between the ground wiring and the power supply wiring and having a characteristic impedance sufficiently low as compared to the characteristic impedance of said transmission line.

14. The semiconductor circuit according to claim 13, wherein said transmission line element has a characteristic impedance to yield a variation in a direct-current power supply voltage applied to said power supply wiring to be 5% or less.

15. The semiconductor circuit according to claim 13, wherein the transmission line element mounted on a semiconductor chip of said semiconductor device has capacitive characteristics for the highest frequency of the high frequencies generated in said semiconductor chip,
the transmission line element mounted on the power supply lead of said semiconductor device has capacitive characteristics for the frequency range lower than the frequency range for the transmission line element mounted on a semiconductor chip, and
the transmission line element mounted on the printed-circuit board has capacitive characteristics for the frequency range lower than the frequency range for the transmission line element mounted on the power supply lead of said semiconductor device.

16. A method of fabricating a semiconductor device having a plurality of transmission lines each formed of a ground wiring to have the ground potential and a power supply wiring to carry a power supply current with an insulating film interposed between the ground wiring and the power supply wiring, including
an element-forming step of forming a transmission line element arranged to relay said power supply current carried between said transmission lines, said transmission line element being formed in a semiconductor chip and formed of said ground wiring and said power supply wiring with a second insulating film interposed between the ground wiring and the power supply wiring, and said transmission line element having a characteristic impedance sufficiently low as compared to the characteristic impedance of said transmission line.

17. The method of fabricating a semiconductor device according to claim 16, wherein said element-forming step comprising the steps of:
forming said ground wiring;

patterning said ground wiring and forming the ground wiring in a corrugated form;

forming said insulating film on said ground wiring; and forming said power supply wiring on said insulating film.

18. The method of fabricating a semiconductor device according to claim 16, wherein said element-forming step comprising the steps of:

forming said ground wiring;

patterning said ground wiring and forming corrugations arranged in a signal transmission direction and also in the direction perpendicular to said signal transmission direction on the ground wiring;

forming said insulating film on said ground wiring; and forming said power supply wiring on said insulating film.

19. The method of fabricating a semiconductor device according to claim 16, wherein said element-forming step comprising the steps of:

forming said ground wiring;

patterning said ground wiring and forming the ground wiring in a corrugated form;

further forming depressions on the corrugated surface;

forming said insulating film on said ground wiring; and forming said power supply wiring on said insulating film.

20. The method of fabricating a semiconductor device according to claim 16, wherein said element-forming step comprising the steps of:

forming said ground wiring;

patterning said ground wiring and forming the ground wiring in a corrugated form;

further forming ridges on the corrugated surface;

forming said insulating film on said ground wiring; and forming said power supply wiring on said insulating film.

21. The method of fabricating a semiconductor device according to claim 16, wherein said element-forming step comprising the steps of:

forming said ground wiring;

patterning said ground wiring and forming the ground wiring such that the ground wiring is formed in a corrugated form and further ridges are formed on the corrugated surface;

forming said insulating film on said ground wiring; and forming said power supply wiring on said insulating film.

22. The method of fabricating a semiconductor device according to claim 16, further comprising steps of:

forming resin layers dividedly on a part of a ground potential surface in a package of a semiconductor device;

forming resin layers in a divided configuration on said ground potential surface;

forming power supply leads for supplying a power supply current from an external circuit on each of said resin layers; and forming a transmission line element having a power supply wiring arranged on said ground potential surface interposing an insulating film, in the position to relay said power supply leads on the divided resin layers, wherein said transmission line element has a characteristic impedance low enough compared to the characteristic impedance of said transmission line.

23. The method of fabricating a semiconductor device according to claim 16, further comprising steps of:

forming a ground potential surface on a part of an insulating substrate in a package of a semiconductor device;

forming a ground potential surface on said insulating substrate;

forming a transmission line element having a power supply wiring arranged on said ground potential surface interposing an insulating film;

forming a though-hole in an insulating layer provided in a piece separate from said insulating substrate;

forming power supply leads for supplying a power supply current supplied to the top of said insulating layer and carried from the top of said insulating layer to the bottom of said through-hole though the internal wall of said though-hole; and affixing said insulating layer to said insulating substrate, and connecting said power supply leads in the bottom of the through-hole and the power supply wiring formed on said transmission line element, respectively.

24. A semiconductor device comprising:

a plurality of transmission lines, formed in a semiconductor chip, each formed of a ground wiring to have the ground potential and a power supply wiring to carry a power supply current with an insulating film interposed between the ground wiring and the power supply wiring, said ground wiring and said power supply wiring formed in a corrugated form with a separation thereof kept at a constant distance; and a transmission line element formed in a semiconductor chip and arranged to relay said power supply current carried between said transmission lines, said transmission line element being formed of one of said ground wirings and a corresponding one of said power supply wirings with an insulating film interposed between the ground wiring and the power supply wiring and having a characteristic impedance sufficiently low as compared to the characteristic impedance of said transmission line.

* * * * *